United States Patent [19]

Correale, Jr.

[11] Patent Number: 4,998,221
[45] Date of Patent: Mar. 5, 1991

[54] MEMORY BY-PASS FOR WRITE THROUGH READ OPERATIONS

[75] Inventor: Anthony Correale, Jr., Raleigh, N.C.

[73] Assignee: International Business Machines Corporation, Armonk, N.Y.

[21] Appl. No.: 429,670

[22] Filed: Oct. 31, 1989

[51] Int. Cl.[5] ............................................. G11C 7/00
[52] U.S. Cl. ............................ 365/189.07; 365/189.04
[58] Field of Search ....................... 365/189.07, 189.04

[56] References Cited

U.S. PATENT DOCUMENTS

| | | | |
|---|---|---|---|
| 4,075,686 | 2/1978 | Calle et al. | 364/200 |
| 4,268,907 | 5/1981 | Porter et al. | 364/200 |
| 4,500,954 | 2/1985 | Duke et al. | 364/200 |
| 4,616,341 | 10/1986 | Andersen et al. | 365/189.04 |
| 4,663,742 | 5/1987 | Andersen et al. | 365/189.07 |
| 4,811,296 | 3/1989 | Garde | 365/189.07 |

Primary Examiner—James W. Moffitt
Attorney, Agent, or Firm—Blaney Harper; J. G. Cockburn; M. H. Klitzman

[57] ABSTRACT

The present invention utilizes bypass circuitry to shorten the cycle time of a cache memory by shortening the time required to perform a write through read operation (WTR). The bypass circuitry senses when a WTR operation will occur by comparing the encoded read and write addresses to determine when the encoded addresses are equal. When the encoded addresses are equal, a WTR operation is requested and the bypass circuitry sends the data to be written into memory to both the write address location and the cache output buffer. The bypass circuitry does not wait to access the data from the memory cells through the read decode, rather, it directly sends the data to the output buffer. The bypass circuitry provides a parallel read and write operations instead of serial operations during a WTR, thereby shortening the machine cycle time. The bypass circuitry also prevents glitches from being sent to the output when the WTR operation is complete by accessing the memory cells through the read decode even though the cells are disconnected from the output buffer during the WTR operation. The cycle time is be shortened by making the longest operation of the memory shorter.

20 Claims, 6 Drawing Sheets

MEMORY BY-PASS FOR WRITE THROUGH READ OPERATIONS

FIELD OF THE INVENTION

This invention relates generally to the field of data processing. More specifically the invention relates to an improved cache memory access system for a data processing system which has a shorter cycle time.

BACKGROUND OF THE INVENTION

Data processing speed in computer systems continues to increase with technological progress in designing and manufacturing central processing units (CPUs) As the speed of processing increases, so does the amount of data processed. Therefore the data needs to be stored in larger and more complex memory systems within the computer system. Along with the memory becoming larger, the required rate at which data is transferred to the CPU from the memory increases. However, as memories become larger they tend to become slower, and therefore limit the speed at which the CPU can work. A typical method of alleviating this problem is to employ a hierarchical memory system. In this type of memory system there is a small amount of fast, lower level, memory and a large amount of slow, higher level, memory. The smaller memory transfers data to and from the CPU very fast. The higher level memory transfers data to and from the lower level memory at a slower rate but it maintains the correct data in the lower level memory necessary for the CPU operations. The higher level memory is not required to run as fast as the lower level memory because the CPU typically asks for the same data many times. The combination of the lower and higher level memory provides the storage capacity and high data transfer rate required of modern computer systems.

The lower level memory, typically called the cache, is required to transfer data to the CPU at a high rate while simultaneously transferring data to and from the higher level memory. Cache memories meet this requirement by having their logic designed in such a manner that the memory cells of the cache can be written to and read from during one access cycle. That is, once the specific data address location is sent to the cache, the CPU can both write and read that location without sending the address to the cache a second time. This operation, known as a Write Through Read (WTR), impacts the entire system performance, by affecting the performance critical path because the CPU can only operate as fast as it can access the memory and the memory can only operate as fast as its slowest operation. The cycle time of the cache access is constant and must be long enough to accomplish its slowest operation. The slowest operation of the cache is the WTR operation because it is a serial combination of the write operation followed by a read operation to the same address. A slower cache access cycle due to the WTR operation, results in fewer instructions performed by the CPU in a given time, which degrades performance in the computer system.

The access time of the Cache is linked to the cycle time of the CPU through the logic associated with the cache. This logic maintains the timing between the CPU and the cache. The CPU will only send the cache a valid address during a defined time of the machine cycle period. The machine cycle is derived from phase clocks which define certain time intervals during which data can be transferred between parts of the computer system. Although there can be one or more phase clocks, there are typically two of them and each logic part outputs data depending on the state of one of the clocks. This results in logic associated with the first clock outputting data when the first clock is in a first state (high or low). The second clock is directly out of phase with the first clock (i.e. second clock is high when the first clock is low and vice versa) and logic associated with the second clock outputs data when the second clock is in a first state (high or low). Therefore, data from one group of logic (associated with the first clock) is shifted to a second group of logic (associated with the second clock) only when no data is being shifted from the second group of logic to the first group. This transfer timing guarantees that the data received by any CPU logic is the data that was meant to be received.

The cache logic receives and holds (or latches) encoded address bits during a second phase of one of the clocks. The data is latched during the second phase because the receiving logic is outputting data during the first phase of the clock. When the second phase of the this clock (first clock) is ended, the first phase of the first clock begins and sends the encoded address bits to decode logic. The results of the decode logic are used to address the cache memory cells. Waiting for the data to be latched during the second phase is wasted time. This wasted time is especially damaging to CPU performance during a read operation in comparison to a write operation. This is because the read operation is just the beginning of the data flow. Once data is read from memory cells, it must be sent through several operations (parity check, table look up, etc.) before it is useful to the CPU. All these operations take time and must be completed before the second phase of the first clock is ended. This is compared to the write operation where the data must be merely written before the second phase of the first clock ends. Since the decode operation is the last operation required before the data is written, there is ample time left in the cycle to finish the write operation. Therefore, the decreasing the read time is of critical importance in improving the CPU performance.

Decreasing the read time in the cache access time by eliminating the wasted time in the read operation does reduce the WTR operation time because of the serial nature of the operation. Decreasing the read time decreases the time for an operation made up of non-overlapping read and write operations. However, the WTR operation is still the longest operation associated with the cache access and therefore defines the cache access time. The serial nature of the operation limits the effectiveness of any improvements in the read or write operations on the overall cache access time.

OBJECTS OF THE INVENTION

It is an object of the claimed invention to improve a cache memory access system.

It is a further object of the claimed invention to improve a cache memory access system in which the machine cycle time is reduced.

It is still another object of the claimed invention to improve a cache memory access system in which the time to perform the read operation is reduced.

It is a still further object of the claimed invention to improve a cache memory access system in which the time to perform the write through read operation is reduced.

It is still another further object of the claimed invention to improve a cache memory access system in which the read through write operation is glitch free.

SUMMARY OF THE INVENTION

The present invention utilizes bypass circuitry to make the write and read operations occur in parallel during a Write Through Read (WTR) operation. The bypass circuitry senses when a WTR operation will occur by comparing the encoded addresses sent to the read and write decode schemes of the cache memory. When the encoded addresses are equal, the bypass circuitry sends data to the memory cells required by the write operation. The bypass circuitry also sends the data directly to the output of the cache memory, bypassing the need to wait until the newly sent data can be stored in the memory cells and read out from the memory cells. Even though the data is not read out of the stored cells, the cells are addressed through the read address circuitry. This is required to prevent glitches from being sent to the cache output when the bypass circuitry is disabled. The use of the bypass circuitry enhances the cache access time in two ways. First it decreases the time required for the WTR operation. Second, because the WTR time is reduced, enhancements to the read operation become more effective.

The above objects and statement of the invention will become more apparent when read in conjunction with the following figures and description of the preferred embodiment:

PREFERRED EMBODIMENT

Figure 1:
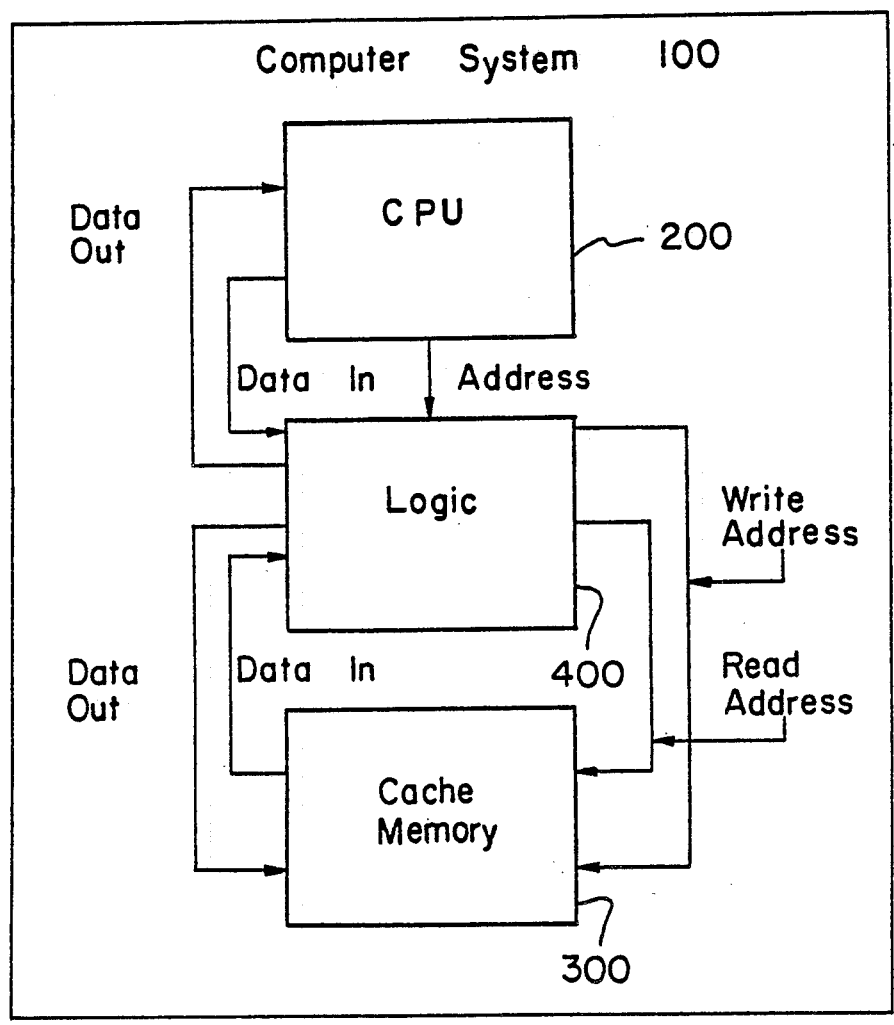
FIG. 1 illustrates a computer system according to the present invention.

A central processing unit (CPU) which requires access to storage obtains that access by generating an address location for data storage within the computer memory. The memory is a cache memory, which can be a variety of sizes and speeds according to the present invention, and either provides data to the CPU, allows the CPU to store data, or both. FIG. 1 shows a computer system 100 according to the present invention. The CPU 200 generates the cache address required and the logic 400 provides the timing between the address request and the address access to the cache memory 300. The logic 400 can be a part of CPU 200, the cache 300, or stand alone as illustrated. The CPU 200 generates an address and sends it to the logic 400. If the address is to be read, the address is sent directly to the cache 300, the address is read, and the data is sent from the cache 300 to the logic 400, and subsequently back to the CPU 200. If the address is to be written to, the address and data are sent to logic 400, the logic 400 sends both the address and data to the cache 300, and the data is written. Finally, if the operation performed by the cache is a write through read (WTR), both data and the address are sent to the logic 400. The data and address are sent to the cache 300 for the cache 300 to be written to. The data to be read from the cache 300 is the same data sent to the cache for writing. This data is then sent from the logic 400 back to the CPU 200 and bypasses the cache memory 300 altogether.

Figure 2:
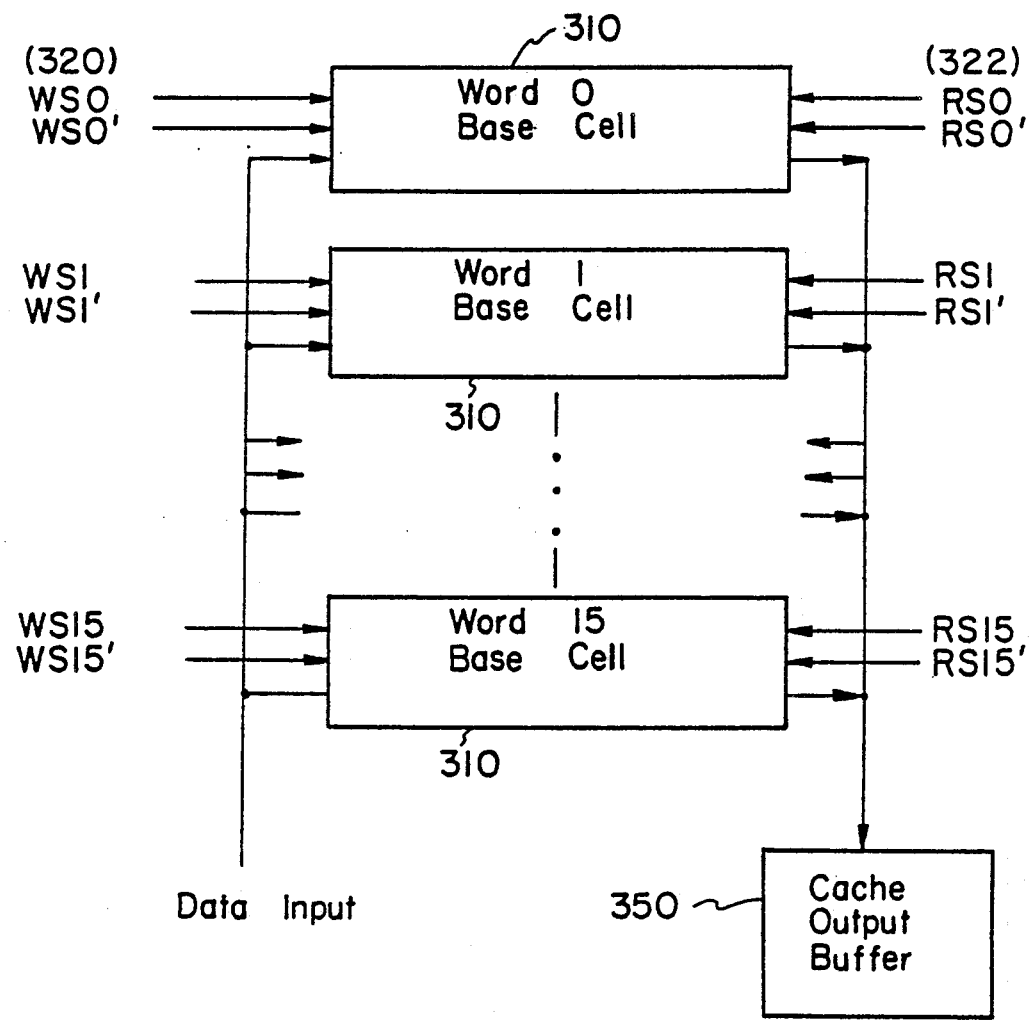
FIG. 2 illustrates the read and write access system for a bit of an M bit cache according to the present invention.

The cache 300 is organized into N words of M bits, N typically being 16 and M typically being 32 in this embodiment. FIG. 2 illustrates the read and write access system for the 0 bit, which is repeated for each of the M bits in the cache. In order to write into a base cell 310 of the cache 300 a write select line (WS) must be activated for the particular word of bit 0 The WS line of word 0 (as with all other N-1 WS lines), denoted WS0 320, is an AND combination of the decoded word 0 address signal (WA0), the write enable signal (We), and a phase clock signal (C2). When the AND boolean combination of these signals is a "1", then the data can be sent to and stored in the base cell 310 through the data input line 325. The combination of the phase clock C2 and the We signal gate write access to the cache memory 300. In a similar manner, the read select signal for bit 0 of word 0 (RS0) 322 is gated by the phase clock C2. The read select line of word 0 (and in a similar manner with the other N-1 words) (RA0) is ANDed with the phase clock C2 to provide read access to the base cell 310.

Figure 3:
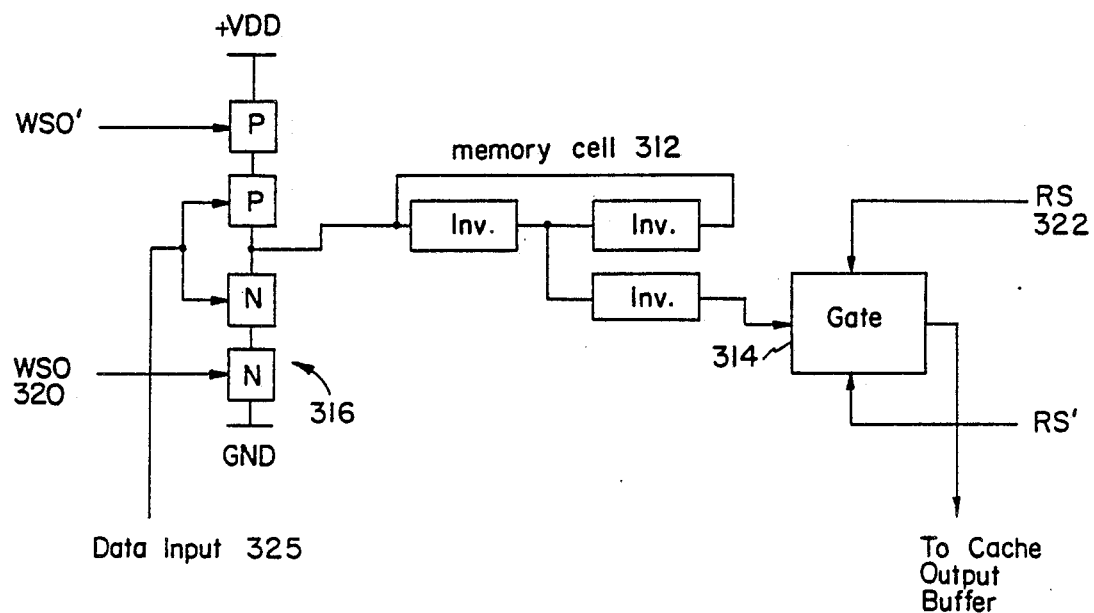
FIG. 3 illustrates the base cell of the cache memory according to the present invention.

FIG. 3 illustrates the base cell 310 of the cache memory 300. The base cell has a memory cell 312, and n/p transfer gate pair 314, and a four device stack 316. The memory cell 312 is a conventional design of cross coupled inverters. The n/p transfer gate pair 314 is a parallel connection of an n-type (NMOS) and a p-type (PMOS) transistors, connected at their respective source and drains. The gate signal for the PMOS transistor is the inverted (complemented) signal of that applied to the gate of the NMOS transistor. This type of transfer gate has a smaller delay (therefore faster operation) time in transmitting from the source to the drains than does a conventional NMOS or PMOS single transistor transfer gate, and provides full logic levels, e.g., GND and VDD. The gate signals for the transfer gate pair are the read select signal, RS0 322, for bit 0 (with the other M-1 bits similarly having RS1, RS2, etc.) and its complement RS0'. Both phases of the read select signal are required in selecting the read bit. The transfer gate 314 is connected to the output of the memory cell 312 so that reading stored data merely requires activating the appropriate read select lines. The four device stack 316 provides the capability to write into the memory cell 312. It is a series combination (source to drain) of two PMOS devices serially connected to two serially connected NMOS devices. The stack is connected between a high potential (typically the power supply for the cache) and a low potential (typically the chip ground). The gate of the lowermost NMOS device is connected to the word select signal (WS0, 320, for word 0, similarly the other n-1 words will have WS1, WS2, etc.) WS0' is the complement of WS0, like the read select signal (and the other word select signals), and used for the uppermost PMOS gate signal. The intermediate PMOS and NMOS gates are each connected to the same data input signal 325. The output of the four device stack 316 is the source/drain connection between the PMOS and NMOS device in the stack. When WS0 320 is selected, the gate stack transfers the signal on the data input line 325 to the input of the memory cell 312.

Figure 4:
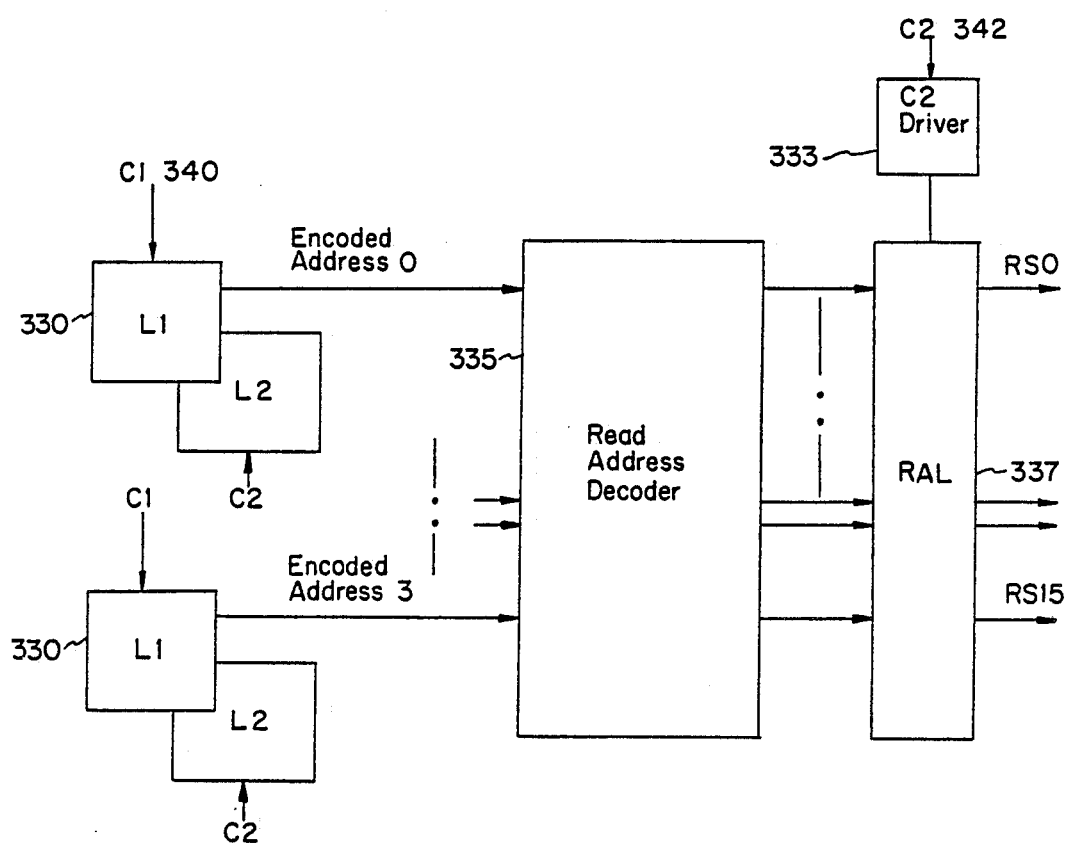
FIG. 4 illustrates the read address decode scheme of the cache memory according to the present invention.

FIG. 4 illustrates how the read select, RS0 322 etc., signals are generated. The CPU 200 generates an encoded address which is stored in a first level of logic, L1 330. This first level of logic is associated with the first phase clock C1 340. L1 330 receives, latches, and sends the encoded address to a read address decoder 335 during the first phase of C1. The read decoder 335 decodes the encoded address and sends it to the read address latches, RAL 337. The RAL 337 is driven by the C2 342 phase clock, when the C2 phase clock changes state, the data is locked into the latch. The decoded addresses are generally sent to the RAL 337 before the end of the first phase of C1, which is also the change of state of C2. The change of state of C2 is the time from which the read delay is measured. Placing the read decode circuitry between L1 330 and RAL 337 rather than prior to L1 330, allows a partial decode to take place should there not be sufficient time prior to C1 340 being deactivated to complete the entire decode. The Prior art systems have generally latched the encoded address on C1 into an L1 latch and passed the captured data when C2 changes state with a second level of logic L2, before sending the encoded address to be decoded. Decoding the data before latching it in RAL 337, eliminates waiting for the decode operation in the critical C2 time period while still avoiding the decode of invalid addresses.

Figure 5:
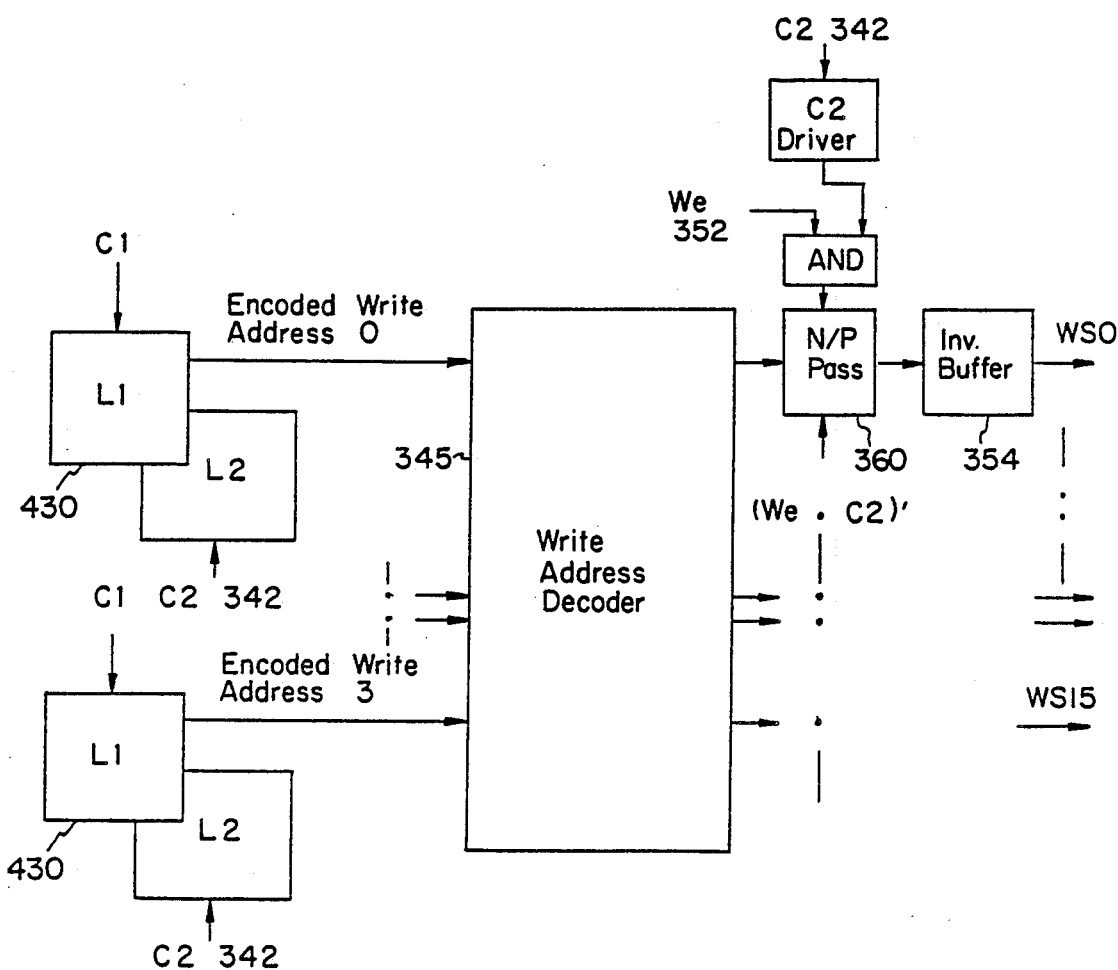
FIG. 5 illustrates the write address decode scheme of the cache memory according to the present invention.

Latching the read address decode output in the RAL 337 gates the read select signals by C2 because the output of the latch is held constant once C2 changes state. The read select signals are then complemented and sent to their respective cells in the cache memory array. To save additional time, at the expense of additional chip area, the decoder can provide both phases of the read select signal which must both be latched at C2 time. The write select signals are generated in a similar manner to the read select signals as illustrated in FIG. 5. L1 430 sends the encoded address to a write address decoder 345 which decodes the encoded address. The decoded address is then gated by an N/P pass transistor 360 into an inverter buffer 354. The gate inputs for the pass transistor 360 are the "AND" combination (both signal and complement) of the write enable signal 352 and the C2 signal 342. The output of the inverter buffer 354, and its associated complement, are the write select signals which are sent to the cache memory cells. The pass transistors gated with the C2 clock provides a function similar to the RAL 337 in terms of having the data valid during a defined time, C2.

Figure 6:
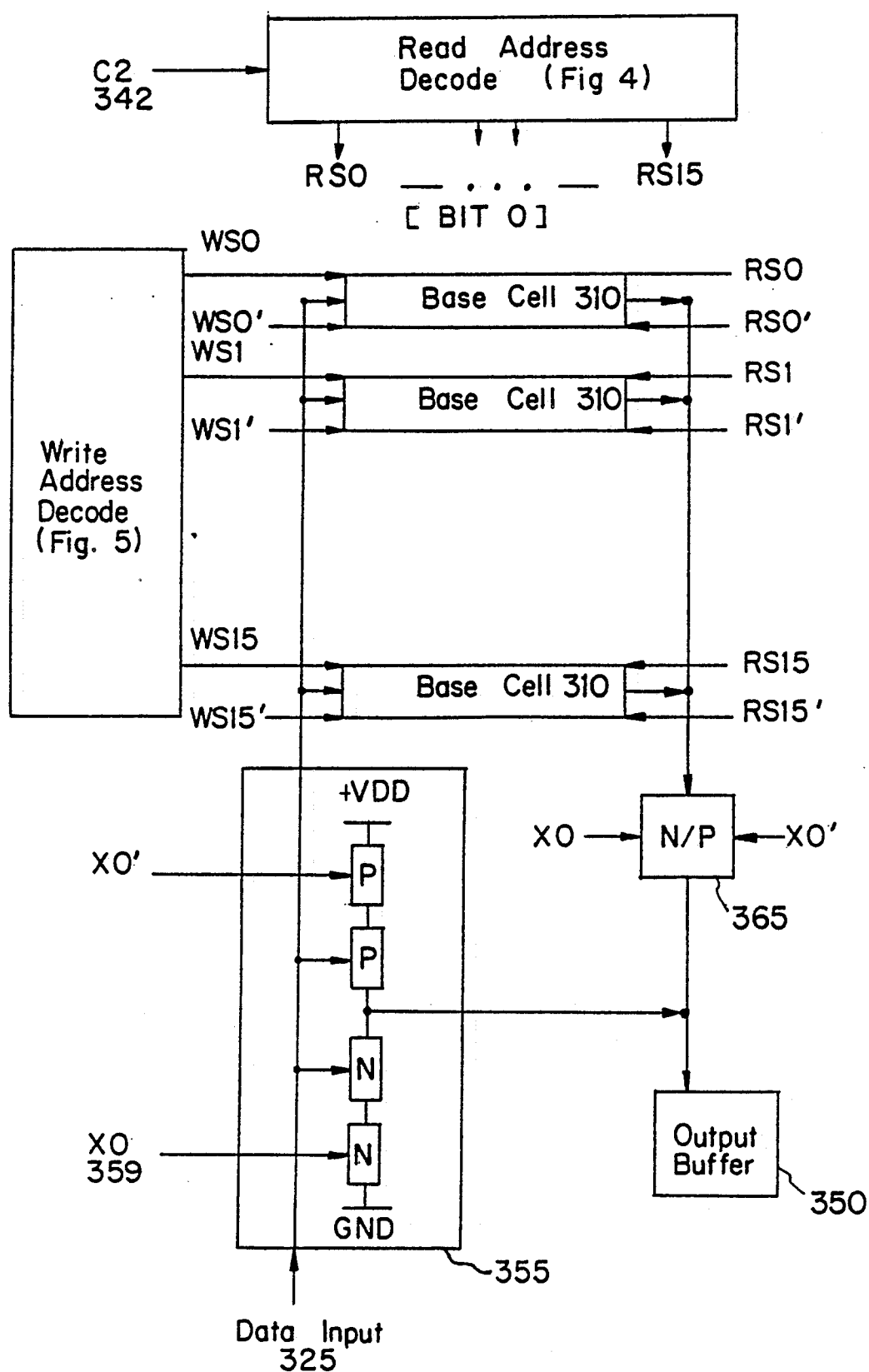
FIG. 6 illustrates the bypass circuitry of the cache memory according to the present invention.

FIG. 6 illustrates the bypass circuitry of the present invention. A four device stack 355 is connected to the data input signal 325 for each bit of the cache (only bit 0 shown here). The output of the four device stack 355 is connected to the output buffer 350 of the cache memory. The output of all the base cell N/P transfer gates 314, comprising all words of the bit, are connected to the input of another N/P transfer gate 365. Finally, the output of this N/P transfer gate 365 is connected to the output buffer 350 of the cache memory. The gate inputs to both the four device stack 355 and the N/P transfer gate 365 is an AND combination (both true and complement), designated Xn 359 (n=0 for bit 0, n=1 for bit 1, etc.), of C2 342, the write enable signal, and a WTR signal 357. The WTR signal 357 is a logical signal indicating when the encoded read address is equal to the encoded write address for a particular word. This signal is generated with a logical compare function such as an exclusive OR tree, comparing the encoded read and write addresses. Since both read and write addresses are stored in L1 latches, the Xn signal 359 is generated prior to the C2 clock and is held valid during the C2 clock period.

Writing and reading the same address during one C2 clock cycle defines when a write through read operation is being performed. When Xn 359 is low, the upper PMOS and lower NMOS devices of the four device stack 355 are off. Also, the N/P transfer gate 365 remains on. In effect, the system writes and reads without interference from the bypass circuitry. When the Xn 359 is high, however, the upper PMOS and lower NMOS devices of the four device stack 355 turn on and the N/P transfer gate 365 disconnects the cache array from the cache output buffer 350. Therefore, the data that would have been written and subsequently read out, is written and simultaneously read out.

The bypass circuitry eliminates a serial combination of write and read operations to the same storage address. The bypass circuitry does not however eliminate the read decode during the WTR operation. This is because performing the read decode allows the output of the N/P transfer gate 314 to reach the same potential as the output of the four device stack 355. When Xn 359 goes low, the N/P transfer gate 365 turns on, and because the potential on either side of the N/P transfer gate 365 is the same, there are no voltage spikes or "glitches" sent to the cache output 350. Therefore, by retaining the read decode in combination with the bypass circuitry, the reliability of the memory is maintained while the required time for the WTR operation is significantly reduced.

The bypass circuitry implemented in the present invention decreases the overall machine cycle time in two ways. First, since the WTR operation is no longer a serial write and read operation, it is not the longest operation required by the cache and so it does not define the minimum machine cycle time necessary for the cache. The operation defining the minimum cycle time in this invention is now a read operation. Second, using the bypass circuitry makes latching the encoded Read address in L1 logic and performing the read decode prior to the L2 logic, rather than latching the encoded Read address in L2 logic, an effective means of reducing the read operation time. The bypass logic of this invention significantly enhances the cache performance. Since the cache is typically a part of the performance critical path of a CPU, the enhanced performance is reflected as an overall CPU performance enhancement.

While this invention has been particularly described and illustrated with reference to a preferred embodiment thereof, it will be understood by those skilled in the art that changes in the above description or illustrations may be made with respect to form or detail without departing from the spirit and scope of the invention.

I claim:
1. A memory system comprising:
 a processing unit for generating address signals;
 storage means for storing data having a plurality of storage cells, said storage means connected to a data input means and coupled to a bypass circuit means;
 decoding means connected to said storage means for decoding address signals from said processing unit and providing access to an address within said storage means, said decoding means provides read access to a read address and write access to a write address, said data input means transferring data to said storage means when said decoding means provides said write access;

logic circuit means associated with said decoding means for generating a control pulse so that said data is written to and read from said storage means simultaneously when said read address equals said write address;

said bypass circuit means connected to a data output means and coupled to said data input means, said bypass circuit means responsive to said control pulse, said bypass circuit means transfers data from said storage means to said data output means when said read address does not equal said write address; and said bypass circuit means disconnects said storage means from said data output means and transfers data from said data input means to said data output means when said write address equals said read address.

2. A memory system as recited in claim 1, wherein:
said control pulse has a first and a second state;
said bypass circuit means couples said data output means to said storage means when said control pulse is in said first state;
when said control pulse is in said second state, said bypass circuit means decouples said data output means from said storage means and couples said data input means to said data output means; and
said bypass circuit means decouples said data input means from said data output means and recouples said storage means to said data output means after coupling said data input means to said data output means when said control pulse is in said second state to prevent voltage spikes from being transmitted to said data output means.

3. A memory system as recited in claim 1, wherein said bypass circuit means comprises:

a four device stack having a first PMOS device connected between a high potential and a second PMOS device, said first PMOS device having a gate connected to a complement of said control pulse, said second PMOS device connected between said first PMOS device and a first NMOS device, said second PMOS device having a gate connected to said data input means, said first NMOS device connected between said second PMOS device and a second NMOS device, said first NMOS device having a gate connected to said data input means, said second NMOS device being connected between said first NMOS device and a low potential, said second NMOS device having a gate connected to said control pulse;

said connection between said second PMOS device and said first NMOS device being connected to said data output means; and an N/P transfer gate connected between said storage cells and said data output means, said transfer gate having a parallel connection of a third PMOS device to a third NMOS device, said third PMOS device having a gate connected to said control pulse, said third NMOS device having a gate connected to said complement of said control pulse.

4. A memory system as recited in claim 3, wherein:
said control pulse has a first and a second state;
said bypass circuit means couples said data output means to said storage means when said control pulse is in said first state;
when said control pulse is in said second state, said bypass circuit means decouples said data output means from said storage means and couples said data input means to said data output means; and
said bypass circuit means decouples said data input means from said data output means and recouples said storage means to said data output means after coupling said data input means to said data output means when said control pulse is in said second state to prevent voltage spikes from being transmitted to said data output means.

5. A memory system comprising:
a processing unit for generating address signals;
storage means for storing data having a plurality of storage cells, said storage means connected to a data input means and coupled to a bypass circuit means;
latch means for latching address signals from said processing unit;
decoding means connected to said storage means and to said latch means, said latch means sending said address signals to said decoding means after said latch means latches said address signals, said decoding means decoding said address signals and providing access to an address within said storage means, said decoding means providing read access to a read address and write access to a write address, said data input means transferring data to said storage means when said decoding means provides said write access;
logic circuit means associated with said decoding means for generating a control pulse so that said data is written to and read from said storage means simultaneously when said read address equals said write address;
said bypass circuit means connected to a data output means and coupled to said data input means, said bypass circuit means responsive to said control pulse, said bypass circuit means transfers data from said storage means to said data output means when said read address does not equal said write address; and
said bypass circuit means disconnects said storage means from said data output means and transfers data from said data input means to
said data output means when said write address equals said read address.

6. A memory system as recited in claim 5, wherein:
said control pulse has a first and a second state;
said bypass circuit means couples said data output means to said storage means when said control pulse is in said first state;
when said control pulse is in said second state, said bypass circuit means decouples said data output means from said storage means and couples said data input means to said data output means; and
said bypass circuit means decouples said data input means from said data output means and recouples said storage means to said data output means after coupling said data input means to said data output means when said control pulse is in said second state to prevent voltage spikes from being transmitted to said data output means.

7. A memory system as recited in claim 5 wherein said bypass circuit means comprises:

a four device stack having a first PMOS device connected between a high potential and a second PMOS device, said first PMOS device having a gate connected to a complement of said control pulse, said second PMOS device connected between said first PMOS device and a first NMOS device, said second PMOS device having a gate connected to said data input means, said first NMOS device connected between said second PMOS device and a second NMOS device, said first NMOS device having a gate connected to said data input means, said second NMOS device being connected between said first NMOS device and a low potential, said second NMOS device having a gate connected to said control pulse;

said connection between said second PMOS device and said first NMOS device being connected to said data output means; and an N/P transfer gate connected between said storage cells and said data output means, said transfer gate having a parallel connection of a third PMOS device to an third NMOS device, said third PMOS device having a gate connected to said control pulse, said third NMOS device having a gate connected to said complement of said control pulse.

8. A memory system as recited in claim 7, wherein:
said control pulse has a first and a second state;
said bypass circuit means couples said data output means to said storage means when said control pulse is in said first state;
when said control pulse is in said second state, said bypass circuit means decouples said data output means from said storage means and couples said data input means to said data output means; and
said bypass circuit means decouples said data input means from said data output means and recouples said storage means to said data output means after coupling said data input means to said data output means when said control pulse is in said second state to prevent voltage spikes from being transmitted to said data output means.

9. A memory unit for use with data and address signals comprising:
storage means for storing data having a plurality of storage cells, said storage means connected to a data input means and coupled to a bypass circuit means;
decoding means connected to said storage means for decoding the address signals and providing access to an address within said storage means, said decoding means provides read access to a read address and write access to a write address, said data input means transferring data to said storage means when said decoding means provides said write access;
logic circuit means associated with said decoding means for generating a control pulse so that said data is written to and read from said storage means simultaneously when said read address equals said write address;
said bypass circuit means connected to a data output means and coupled to said data input means, said bypass circuit means responsive to said control pulse, said bypass circuit means transfers data from said storage means to said data output means when said read address does not equal said write address; and said bypass circuit means disconnects said storage means from said data output means and transfers data from said data input means to said data output means when said write address equals said read address.

10. A memory unit as recited in claim 9, wherein:
said control pulse has a first and a second state;
said bypass circuit means couples said data output means to said storage means when said control pulse is in said first state;
when said control pulse is in said second state, said bypass circuit means decouples said data output means from said storage means and couples said data input means to said data output means; and
said bypass circuit means decouples said data input means from said data output means and recouples said storage means to said data output means after coupling said data input means to said data output means when said control pulse is in said second state to prevent voltage spikes from being transmitted to said data output means.

11. A memory unit as recited in claim 9, wherein said bypass circuit means comprises:
a four device stack having a first PMOS device connected between a high potential and a second PMOS device, said first PMOS device having a gate connected to a complement of said control pulse, said second PMOS device connected between said first PMOS device and a first NMOS device, said second PMOS device having a gate connected to said data input means, said first NMOS device connected between said second PMOS device and a second NMOS device, said first NMOS device having a gate connected to said data input means, said second NMOS device being connected between said first NMOS device and a low potential, said second NMOS device having a gate connected to said control pulse;
said connection between said second PMOS device and said first NMOS device being connected to said data output means; and
an N/P transfer gate connected between said storage cells and said data output means, said transfer gate having a parallel connection of a third PMOS device to a third NMOS device, said third PMOS device having a gate connected to said control pulse, said third NMOS device having a gate connected to said complement of said control pulse.

12. A memory unit as recited in claim 11, wherein:
said control pulse has a first and a second state;
said bypass circuit means couples said data output means to said storage means when said control pulse is in said first state;
when said control pulse is in said second state, said bypass circuit means decouples said data output means from said storage means and couples said data input means to said data output means; and
said bypass circuit means decouples said data input means from said data output means and recouples said storage means to said data output means after coupling said data input means to said data output means when said control pulse is in said second state to prevent voltage spikes from being transmitted to said data output means.

13. A memory unit for use with data and address signals comprising:

storage means for storing data having a plurality of storage cells, said storage means connected to a data input means and coupled to a bypass circuit means;

latch means for latching said address signals;

decoding means connected to said storage means and to said latch means, said latch means sending said address signals to said decoding means after said latch means latches said address signals, said decoding means decoding said address signals and providing access to an address within said storage means, said decoding means providing read access to a read address and write access to a write address, said data input means transferring data to said storage means when said decoding means provides said write access;

logic circuit means associated with said decoding means for generating a control pulse so that said data is written to and read from said storage means simultaneously when said read address equals said write address;

said bypass circuit means connected to a data output means and coupled to said data input means, said bypass circuit means responsive to said control pulse, said bypass circuit means transfers data from said storage means to said data output means when said read address does not equal said write address; and said bypass circuit means disconnects said storage means from said data output means and transfers data from said data input means to said data output means to said storage cells and said data output means so that said data can be written to and read from said storage means simultaneously when said write address equals said read address.

14. A memory unit as recited in claim 13, wherein:
said control pulse has a first and a second state;
said bypass circuit means couples said data output means to said storage means when said control pulse is in said first state;
when said control pulse is in said second state, said bypass circuit means decouples said data output means from said storage means and couples said data input means to said data output means; and
said bypass circuit means decouples said data input means from said data output means and recouples said storage means to said data output means after coupling said data input means to said data output means when said control pulse is in said second state to prevent voltage spikes from being transmitted to said data output means.

15. A memory unit as recited in claim 13, wherein said bypass circuit means comprises:
a four device stack having a first PMOS device connected between a high potential and a second PMOS device, said first PMOS device having a gate connected to a complement of said control pulse, said second PMOS device connected between said first PMOS device and a first NMOS device, said second PMOS device having a gate connected to said data input means, said first NMOS device connected between said second PMOS device and a second NMOS device, said first NMOS device having a gate connected to said data input means, said second NMOS device being connected between said first NMOS device and a low potential, said second NMOS device having a gate connected to said control pulse;

said connection between said second PMOS device and said first NMOS device being connected to said data output means; and an N/P transfer gate connected between said storage cells and said data output means, said transfer gate having a parallel connection of a third PMOS device to an third NMOS device, said third PMOS device having a gate connected to said control pulse, said third NMOS device having a gate connected to said complement of said control pulse.

16. A memory unit as recited in claim 15, wherein:
said control pulse has a first and a second state;
said bypass circuit means couples said data output means to said storage means when said control pulse is in said first state;
when said control pulse is in said second state, said bypass circuit means decouples said data output means from said storage means and couples said data input means to said data output means; and
said bypass circuit means decouples said data input means from said data output means and recouples said storage means to said data output means after coupling said data input means to said data output means when said control pulse is in said second state to prevent voltage spikes from being transmitted to said data output means.

17. A method for accessing data storage in a memory system comprising:
receiving address signals;
decoding a read address and a write address from said address signals, said read and write addresses specifying storage cells for storing data within a storage means, said storage means being connected to a data input means and coupled to a bypass circuit means;
transferring said data from said input means to said storage means when said decoding means decodes said write address;
generating a control pulse, said control pulse having a first and second state when said read address equals said write address;
transferring said data from said storage means to a data output means through said bypass circuit means after said read address has been decoded when said control pulse is in said first state;
decoupling said storage means from said bypass circuit means and coupling said input means to said output means through said bypass circuit means when said control pulse is in said second state; and
transferring said data from said data input means to said data output means through said bypass circuit means when said control pulse is in said second state so that data can be written to and read from said storage means simultaneously.

18. A method for accessing data storage as recited in claim 17, further comprising:
recoupling said data output means to said data storage means through said bypass circuit means when said control pulse is in said second state after decoupling said data storage means from said data output means during said second state of said control pulse; and
maintaining said data, transferred from said data input means to said data storage means when said decoding means decodes said write address, in said storage cells at least until said output means is recoupled to said storage means to prevent voltage spikes from being transmitted to said data output means.

19. A method for accessing data storage in a memory system comprising:
- receiving address signals;
- latching said address signals;
- decoding a read address and a write address from said address signals after latching said address signals, said read and write addresses specifying storage cells for storing data within a storage means, said storage means being connected to a data input means and coupled to a bypass circuit means;
- transferring said data from said input means to said storage means when said decoding means decodes said write address;
- generating a control pulse, said control pulse having a first and second state when said read address equals said write address;
- transferring said data from said storage means to a data output means through said bypass circuit means after said read address has been decoded when said control pulse is in said first state;
- decoupling said storage means from said bypass circuit means and coupling said input means to said output means through said bypass circuit means when said control pulse is in said second state; and
- transferring said data from said data input means to said data output means through said bypass circuit means when said control pulse is in said second state so that said data can be written to and read from said storage means simultaneously.

20. A method for accessing data storage as recited in claim 19, further comprising:
- recoupling said data output means to said data storage means through said bypass circuit means when said control pulse is in said second state after decoupling said data storage means from said data output means during said second state of said control pulse; and
- maintaining said data, transferred from said data input means to said data storage means when said decoding means decodes said write address, in said storage cells at least until said output means is recoupled to said storage means to prevent voltage spikes from being transmitted to said data output means.

* * * * *